United States Patent [19]
Suzuki et al.

[11] Patent Number: 5,309,013
[45] Date of Patent: May 3, 1994

[54] PHOTOELECTRIC CONVERSION DEVICE

[75] Inventors: Toshiji Suzuki, Machida; Shigeyuki Matsumoto, Atsugi, both of Japan

[73] Assignee: Canon Kabushiki Kaisha, Tokyo, Japan

[21] Appl. No.: 960,290

[22] Filed: Oct. 13, 1992

Related U.S. Application Data

[63] Continuation of Ser. No. 698,323, May 6, 1991, abandoned, which is a continuation of Ser. No. 281,968, Nov. 30, 1988, abandoned, which is a continuation of Ser. No. 854,863, Apr. 23, 1986, abandoned.

[30] Foreign Application Priority Data

Apr. 30, 1985 [JP] Japan .................. 60-91133

[51] Int. Cl.⁵ .................. H01L 29/72; H01L 31/10
[52] U.S. Cl. .................. 257/446; 257/462
[58] Field of Search .................. 357/34, 30, 50; 257/446, 462

[56] References Cited

U.S. PATENT DOCUMENTS

| | | | |
|---|---|---|---|
| 3,624,428 | 11/1971 | Weimer | 357/32 |
| 3,676,727 | 2/1972 | Dalton | 357/31 |
| 3,810,796 | 5/1974 | Skaggs et al. | 357/31 |
| 3,828,232 | 8/1974 | Horiike et al. | 357/31 |
| 3,858,233 | 12/1974 | Miyata et al. | 357/31 |
| 3,911,269 | 10/1975 | Hart | 357/30 |
| 4,072,975 | 2/1978 | Ishitani | 357/23.4 |
| 4,160,985 | 7/1979 | Kamins et al. | 357/31 |
| 4,425,574 | 1/1984 | Silvestri et al. | 357/34 |
| 4,450,466 | 5/1984 | Nishizawa et al. | 357/30 D |
| 4,593,320 | 6/1986 | Nishizawa et al. | 357/24 LR |
| 4,608,749 | 9/1986 | Harada et al. | 357/24 LR |
| 4,623,909 | 11/1986 | Nishizawa et al. | 357/30 D |
| 4,630,091 | 12/1986 | Kuroda et al. | 357/24 LR |
| 4,686,554 | 7/1987 | Ohmi et al. | 357/34 |
| 4,717,945 | 1/1988 | Yusa et al. | 357/30 |

FOREIGN PATENT DOCUMENTS

| | | |
|---|---|---|
| 0132076 | 1/1985 | European Pat. Off. . |
| 3326924 | 2/1984 | Fed. Rep. of Germany . |
| 2098323 | 3/1972 | France . |
| 57-207384 | 12/1982 | Japan .................. 357/34 |
| 2077490 | 12/1981 | United Kingdom .................. 357/23.6 |

OTHER PUBLICATIONS

International Electron Devices Meeting, Technical Digest, Dec. 13-15, 1982, San Francisco, Calif., pp. 62-65.

Primary Examiner—Jerome Jackson
Attorney, Agent, or Firm—Fitzpatrick, Cella, Harper & Scinto

[57] ABSTRACT

A photoelectric conversion device has a plurality of photoelectric conversion cells, each cell having a semiconductor transistor comprising two main electrode regions made of one conductive type semi-conductor and a control electrode region made of another conductive type semiconductor and a capacitor for controlling the control electrode region at a floating state, the potential at the control electrode region at a floating state being controlled by means of the capacitor so that carriers generated by light are stored in the control electrode region and the output of each cell is controlled in accordance with the storage voltage generated by the storage. In such a photo-electric conversion device, an isolation region for electrically insulating adjacent photoelectric conversion cells includes an insulation region and a semiconductor region of high impurity density formed beneath the insulation region; and the semiconductor region of high impurity density is made of the same conductive type semiconductor as the main electrode regions.

2 Claims, 8 Drawing Sheets

PHOTOELECTRIC CONVERSION DEVICE

This application is a continuation of application Ser. No. 07/698,323 filed May 6, 1991, now abandoned which is a continuation of application Ser. No. 07/281,968 filed Nov. 30, 1988, abandoned, which is a continuation of application Ser. No. 06/854,863 filed Apr. 23, 1986, abandoned.

BACKGROUND OF THE INVENTION

1. Field of the Invention

The present invention relates to a photoelectric conversion device having a charge storage region whose potential can be controlled by means of a capacitor.

2. Related Background Art

FIG. 1A is a schematic plan view illustrating a photoelectric conversion device described in the Official Gazette of an EPC laid-open publication No. 0132076, and, FIG. 1B is a cross section along line I—I of FIG. 1A.

In the figures, photosensor cells are formed disposed on an n+ silicon substrate 101, each photo-sensor cell being electrically insulated from adjacent cells by an element isolation region 102 made of material such as $SiO_2$, $Si_3N_4$, or polysilicon.

Each photosensor cell is constructed as in the following:

On an n− region 103 of low impurity density which is formed by epitaxial technique or the like, there is formed a p region 104 by doping p-type impurities within which p region an n+ region 105 is formed by impurity diffusion technique or ion implantation technique. The p region 104 and n+ region 105 constitute the base and emitter of a bipolar transistor, respectively.

On the p region 104 and n+ region 105 formed on the n− region 103, there is formed an oxidized film 106 on which a capacitor electrode 107 having a predetermined area is formed. The capacitor electrode 107 faces the p region 104, the oxidized film 106 being interposed therebetween. Thus, by applying a voltage to the capacitor electrode 107, the potential of the p region 104 at a floating state can be controlled.

In addition, there are formed an emitter electrode connected to the n+ region 105, an interconnection 109 for reading a signal from the emitter electrode and outputting it to an external circuit, an n+ region 111 of high impurity density on the back of the substrate, and an electrode 112 for applying a potential to the collector of the bipolar transistor.

Next, the fundamental operation of the above-described photosensor will be described. Light 113 is applied to the p region 104 or the base of the bipolar transistor to thereby store the charge corresponding to light quantity (storage operation). The base potential varies with, the stored charge. By reading a potential change from the emitter electrode at a floating state, an electrical signal corresponding to the incident light quantity can be obtained (readout operation). To eliminate the stored charge in the p region 104, the emitter electrode 108 is grounded and the capacitor electrode 107 is applied with a positive pulse voltage (refreshing operation). Since the p region 104 is forward-biased relative to the n+ region 105 by applying the positive pulse voltage, the stored charge is eliminated. The above operations, i.e., storage, readout and refreshment are repeated.

In summary, according to the proposed method, the charge generated by incident light is stored in the p region 104 or the base so that current flowing through the emitter electrode 108 and collector electrode 112 can be controlled. Thus, the stored charge is amplified at each cell and thereafter is read so that a high output and sensitivity as well as a low noise level can be achieved.

The base potential $V_p$ generated by the holes stored in the base through light excitation is given by Q/C, wherein Q represents the charge quantity of holes stored in the base, and C represents a capacitance connected to the base. As apparent from the above relationship, a high integration of the photo-sensor leads to a reduction in cell size as well as a reduction in values of Q and C, so that the potential $V_p$ generated through light excitation is maintained substantially constant. Consequently, the proposed method is considered also effective for high resolution of the photosensor in the future.

However, for the above-described, conventional photoelectric conversion device, deep etching is required for forming the element isolation region 102 for electrically insulating each cell, thereby resulting in a problem that the manufacturing process becomes complicated.

Furthermore, this deep etching causes other problems such as an increase in leakage current between cells due to damages of the substrate 101 and due to stress at the interfacial surface between the n− layer 103 and the isolation region 102.

SUMMARY OF THE INVENTION

An object of the present invention is to provide a photoelectric conversion device solving the above-mentioned conventional problems. Another object of the present invention is to provide a photoelectric conversion device having a plurality of photoelectric conversion cells, each cell having a semiconductor transistor comprising two main electrode regions made of one conductive type semiconductor and a control electrode region made of another conductive type semiconductor and a capacitor for controlling said control electrode region at a floating state, the potential at said control electrode region at a floating state being controlled by means of said capacitor so that carriers generated by light are stored in said control electrode region and the output of each cell is controlled in accordance with the storage voltage generated by said storage; wherein an isolation region for electrically insulating adjacent photoelectric conversion cells comprises an insulation region and a semiconductor region of high impurity density formed beneath said insulation region; and said semiconductor region of high impurity density is made of the same conductive type semiconductor as said main electrode regions.

DETAILED DESCRIPTION OF THE PREFERRED EMBODIMENT

The embodiment of the present invention will now be described in detail with reference to the accompanying drawings.

Figure 1A:
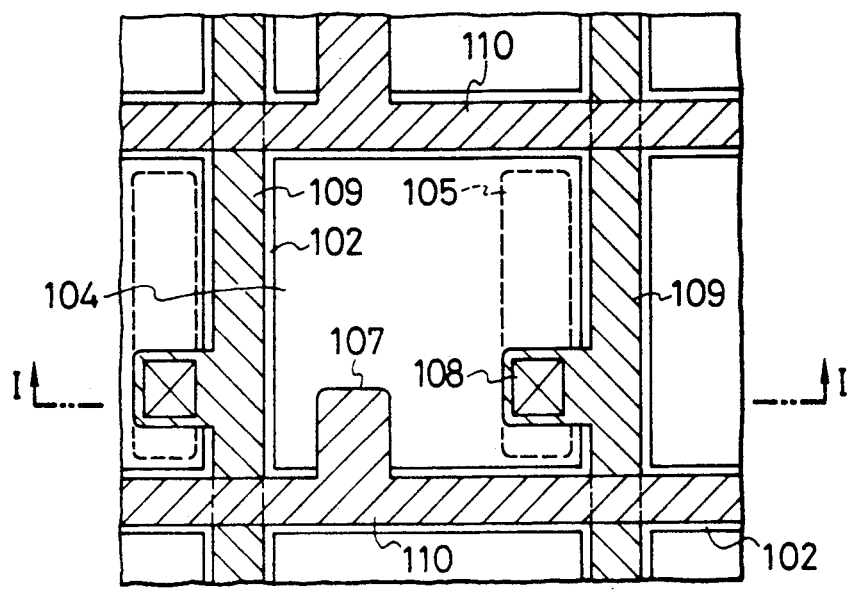
FIG. 1A is a schematic plan view illustrating a conventional photoelectric conversion device.
Figure 1B:
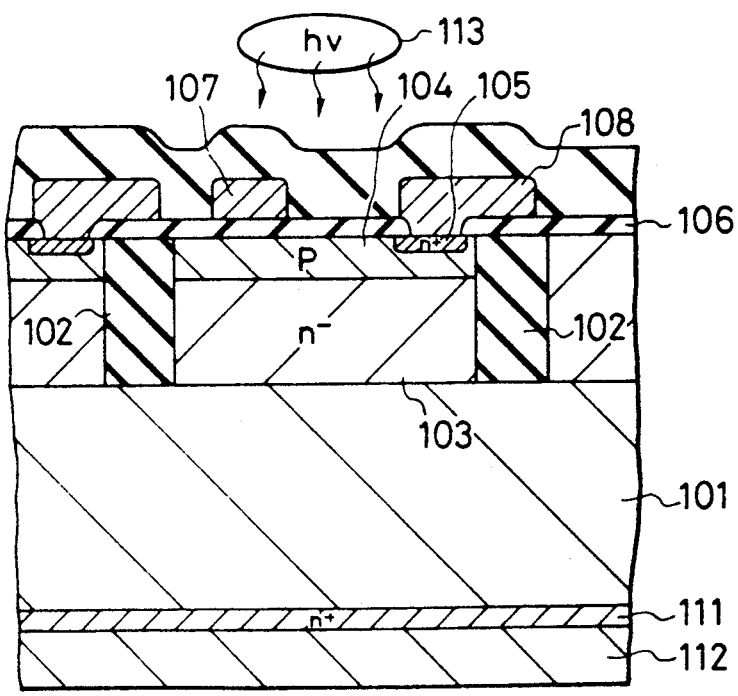
FIG. 1B is a cross section along line I—I of FIG. 1A.
Figure 2A:
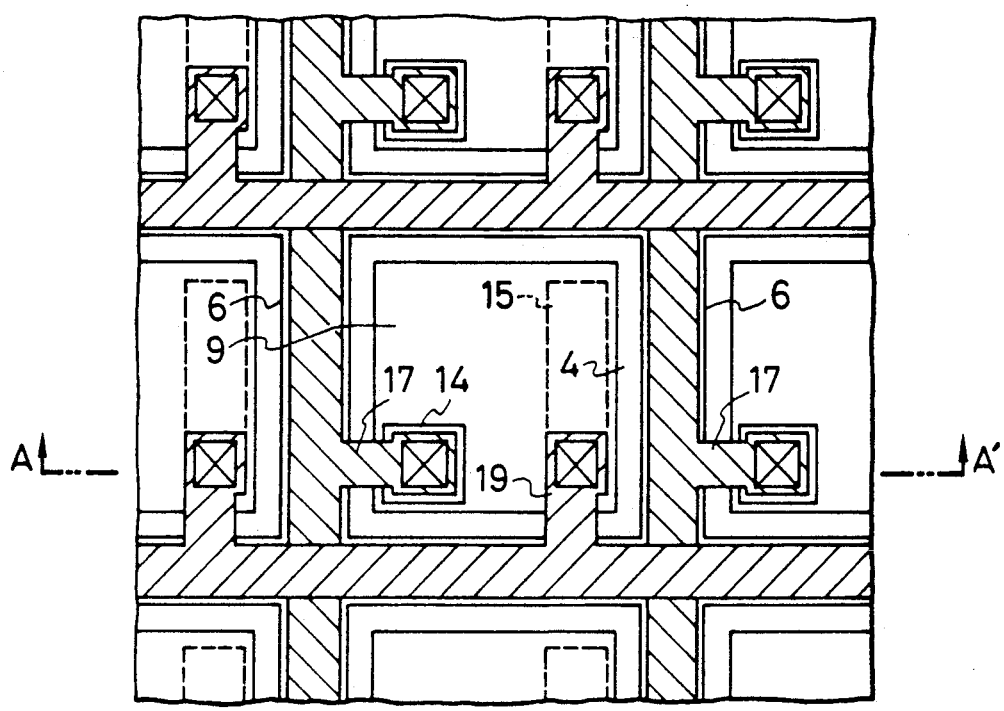
FIG. 2A is a plan view showing an embodiment of a photoelectric conversion device according to the present invention.
Figure 2B:
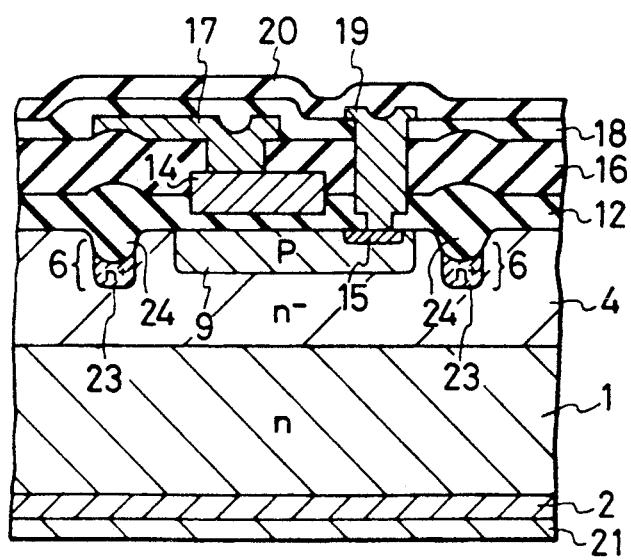
FIGS. 2B and 2C are cross sections of a single cell along line A—A' of FIG. 2A.
Figure 2C:
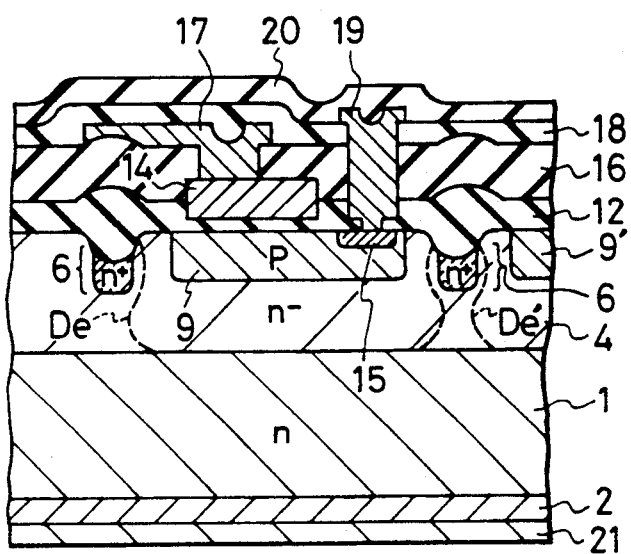

FIG. 2A is a schematic plan view showing an embodiment of the photoelectric conversion device according to the present invention, and FIGS. 2B and 2C are cross sections of a single cell along line A—A' of FIG. 2A.

Referring specifically to FIGS. 2A and 2B, on an n silicon subtrate 1, there is formed an n− epitaxial layer 4 within which photosensor cells are disposed each electrically insulated by element isolation regions 6. The element isolation region 6 is constructed of a field oxidized film 24 and an n+ region 23 formed underneath the field oxidized film 24. An adequate voltage is applied to the n+ region 23 through an unrepresented electrode, as will be described later.

Each photosensor cell comprises: a p base region 9 and an n+ emitter region 15 of a bipolar transistor formed within the n− epitaxial region 4; a polysilicon electrode 14 of a capacitor for applying a pulse to the p base region 9 via an oxidized film 12 interposed therebetween; an electrode 19 connected to the n+ emitter region 15; an electrode 17 connected to the polysilicon electrode 14; and n+ region 2 of high impurity density at the back of the substrate 1; and an electrode 21 for applying a potential to the collector of the bipolar transistor.

According to the fundamental operation of this embodiment, the p base region 9 biased to a negative potential is first made into a floating state as described previously, and holes among pairs of electrons and holes are stored in the p base region 9 (storage operation). Succeedingly, the emitter and base are forward-biased to read, from the emitter at a floating state, the storage voltage generated by the stored holes (readout operation). Then, by grounding the emitter and applying a positive pulse voltage to the polysilicon electrode 14 of the capacitor, the stored holes in the p base region 9 are eliminated via the emitter (refreshing operation). By eliminating the stored holes, the p base region 9 resumes an initial condition biased to a negative potential when the refreshing positive pulse voltage falls down.

The widening of a depletion layer De at this initial condition is schematically shown in FIG. 2C. As shown in the figure, the depletion layer De is not likely to superpose on a depletion layer De' of the adjacent cell due to the presence of the element isolation region 6, thus ensuring a reliable isolation between respective cells.

The more detailed explanation will be given with reference to FIG. 3.

Figure 3A:
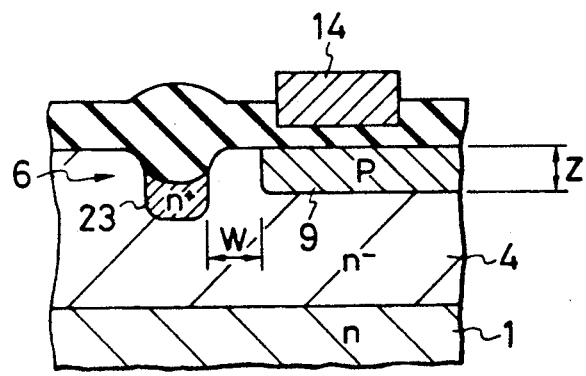
FIG. 3A is a schematic, partial cross section of the embodiment.

FIG. 3A is a schematic, partial cross section of this embodiment. In the figure, the depth of the p base region 9 is represented by Z, the distance between the p base region 9 and the n+ region 23 is represented by W, and the thickness of the n− layer 4 is assumed 5 $\mu$m.

In this embodiment, for example, on the condition that the density X of the n− layer 4, the density Y of the n+ region 23 and the depth Z of the p base region 9 are varied, the considerable factors causing the photoelectric conversion device to become nonoperative are the breakdown voltage between the p base region 9 and the n+ region 23 and the incompleteness of element isolation due to the widening of depletion layers.

An example of distances W affording a satisfactory factory breakdown voltage is shown in Table 1 with X, Y and Z varied.

TABLE 1

| $X(\times 10^{13} cm^{-3})$ | $Y(\times 10^{17} cm^{-3})$ | Z ($\mu$m) | W ($\mu$m) |
|---|---|---|---|
| 30 | 5 | 0.8 | 1.4 or larger |
| 30 | 30 | 0.8 | 1.5 or larger |
| 30 | 5 | 0.6 | 1.2 or larger |
| 5 | 5 | 0.8 | 1.6 or greater |
| 5 | 30 | 0.8 | 1.7 or larger |
| 5 | 5 | 0.6 | 1.4 or larger |

Figure 3B:
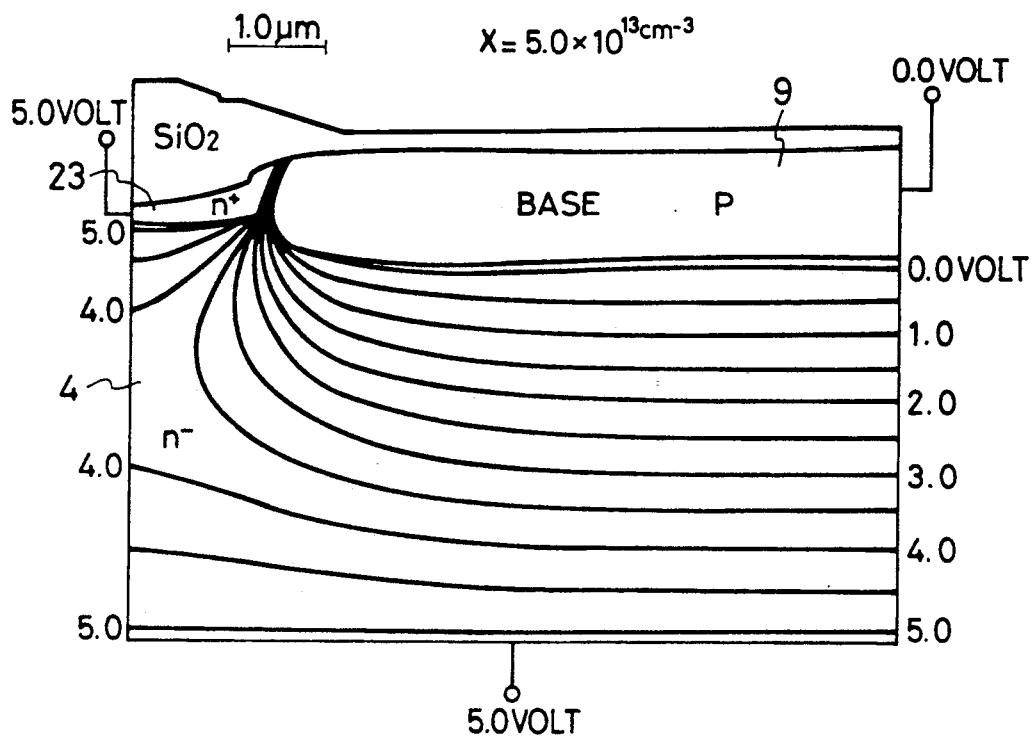
FIG. 3B and 3C are potential distribution graphs of the embodiment at the vicinity of the element isolation region.
Figure 3C:
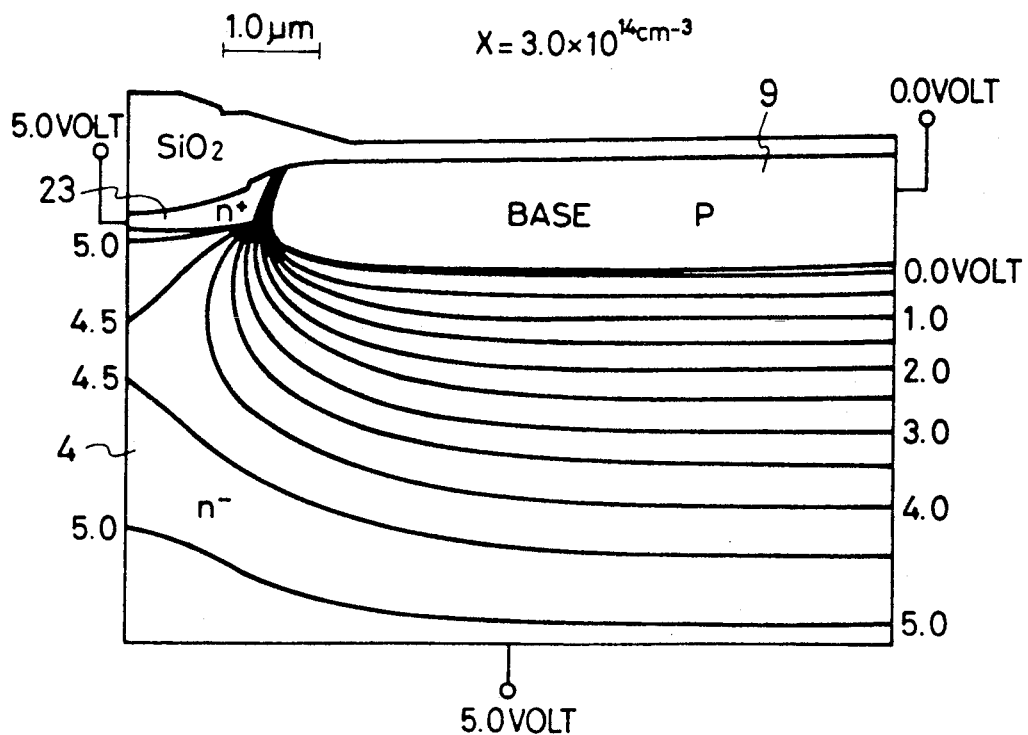

FIGS. 3B and 3C are potential distribution graphs near the element isolation region of this embodiment, wherein $Y = 5 \times 10^{17} cm^{-3}$ and $W = 1$ $\mu$m.

As shown in FIGS. 3B and 3C, by applying the same voltage as that of the collector n− layer 4 to the n+ region 23, a potential barrier is formed between adjacent cells. Therefore, carriers generated by light do not flow into adjacent cells, thus ensuring a substantial element isolation even if a connection between depletion layers may occur.

Next, the manufacturing processes of this embodiment will described.

FIGS. 4A to 4L illustrate the manufacturing processes of this embodiment.

Figure 4A:
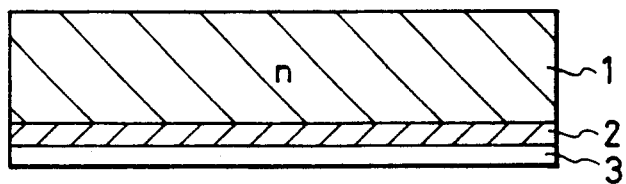
FIGS. 4A to 4L are views illustrating the manufacturing processes of the photoelectric conversion device of the embodiment.
Figure 4B:
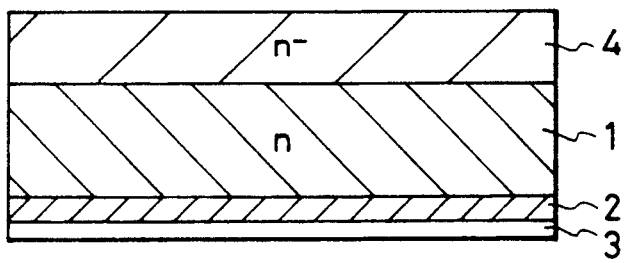

First, as shown in FIG. 4A, at the back of an n type silicon substrate 1 having an impurity density of $1 \times 10^{15}$ to $1 \times 10^{18} cm^{-3}$, an n+ layer 2 for use in ohmic contact having an impurity density of $1 \times 10^{17}$ to $1 \times 10^{20} cm^{-3}$ is formed by diffusing P, As or Sb. Next, on the n+ layer 2 an oxidized film 3 (e.g., SiO$_2$ film) having a thickness of 3000 to 7000 Å is formed by means of a CVD method.

The oxidized film 3, which is called a back coat, is used for preventing impurity vapor from being generated during a heat treatment process of the substrate 1.

Next, the surface of the substrate is etched for about 1.5 minute under the condition of temperature at 1000° C., 2l/min of HC and 60l/min of H$_2$. Thereafter, an n− epitaxial layer 4 (hereinafter referred to as n− layer 4) is formed under the condition of, for example, 1.2l/min of source gas SiH$_2$Cl$_2$ (100%), 100 cc flow of doping gas (20 PPM PH$_3$ diluted by H$_2$), growing temperature of 100° C. and reduced pressure at 120 to 180 Torr. The monocrystal growing rate is 0.5 m/min, the thickness of the monocrystal is 2 to 10 $\mu$m. The impurity density is $1 \times 10^{12}$ to $10^{16} cm^{-3}$, or preferably $10^{12}$ to $10^{14} cm^{-3}$ [FIG. 4B].

To improve the quality of the n− layer 4, it is also very effective to use such a substrate having a denuded zone and capable of undergoing intrinsic gettering. To this end, the substrate is first subjected to a high temperature heat treatment at 1150 to 1250° C. to remove oxygen near at the surface, following a long time heat treatment at about 800° C. to produce plural microdefects in the substrate.

Next, on the n− layer 4 a pad oxidized film 8 of 500 to 1500 Å thickness is formed by means of pyrogenic oxidation (H$_2$O$_2$), wet oxidation (O$_2$+H$_2$O), steam oxidation (N$_2$+H$_2$O) or dry oxidation. To obtain a good oxidized film without lamination defects, a high pressure oxidation at temperature of 800 to 1000° C. is preferable.

Figure 4C:
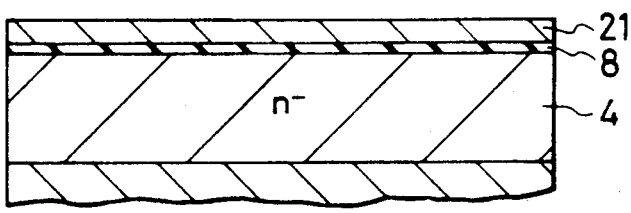

Thereafter, a nitride film (Si$_3$N$_4$) 21 of 1000 to 2000 Å thickness is deposited by means of an LPCVD method or P-CVD method [FIG. 4C].

In this example, the LPCVD method was employed under the condition of deposition temperature of 770 to 830° C., degree of vacuum at 0.1 to 0.3 Torr, 20 to 30 SCCM of SiH$_2$Cl$_2$, and 70 to 150 SCCM of NH$_3$, which led to a good result.

Figure 4D:
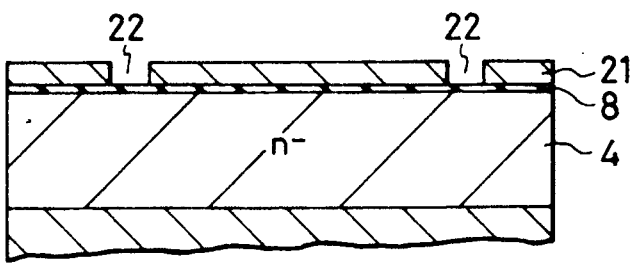
Figure 4E:
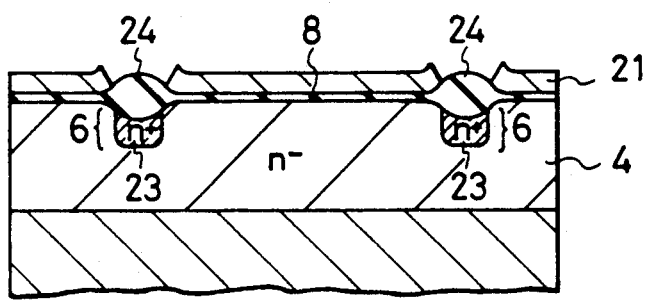

Next, the nitride film 21 located where an element isolation region 6 is to be formed is selectively removed by means of a dry etching method to form an opening 22 [FIG. 4D].

Succeedingly, impurity ions such as As or P are implanted into the n$^-$ region 4 by means of an ion implantation method, using the nitride film 21 as a mask.

Next, after electrically activating through heat treatment under N$_2$ atmosphere, a thick field oxidized film 24 is selectively formed at the opening 22 of the nitride film 21 by means of a LOCOS oxidation method, and the n$^+$ region 23 is formed down to a predetermined depth. Consequently, an element isolation region 6 including the n$^+$ region 23 is formed beneath the field oxidized film 24 [FIG. 4E].

Next, the nitride film 21 is completely removed with heated phosphoric acid to expose the oxidized film 8 and the field oxidized film 24. The oxidized film 8 is provided for preventing channeling and surface defects during the process for forming a base region through ion implantation. In the above process, the back coat oxidized film 3 is completely removed.

Figure 4F:
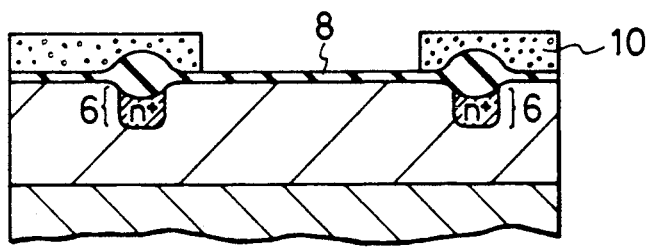

Succeedingly, a resist 10 is coated, the part of which where the base region is formed is selectively removed [FIG. 4F].

Next, B$^+$ ions or BF$_2^+$ ions produced using BF$_3$ as material gas are implanted into the wafer. The surface density thereof is $1 \times 10^{15}$ to $5 \times 10^{18}$ cm$^{-3}$, or preferably 1 to $20 \times 10^{16}$ cm$^{-3}$, while the doping amount of ions is $7 \times 10^{11}$ to $1 \times 10^{15}$ cm$^{-2}$, or preferably $1 \times 10^{12}$ to $1 \times 10^{14}$ cm$^{-2}$.

Figure 4G:
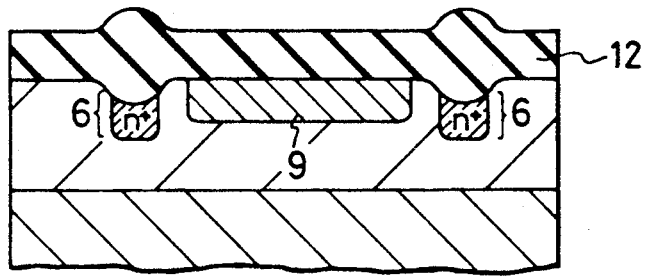
Figure 4H:
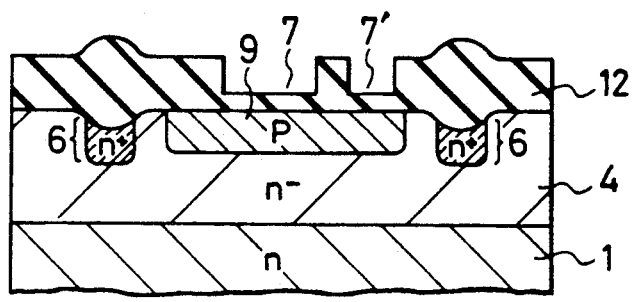
Figure 4I:
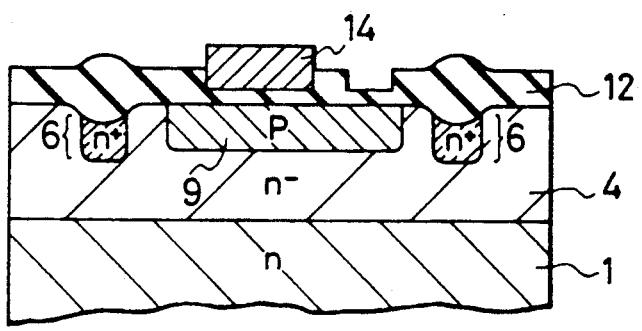
Figure 4J:
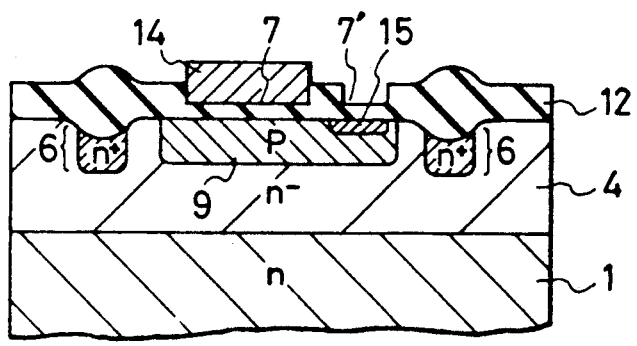
Figure 4K:
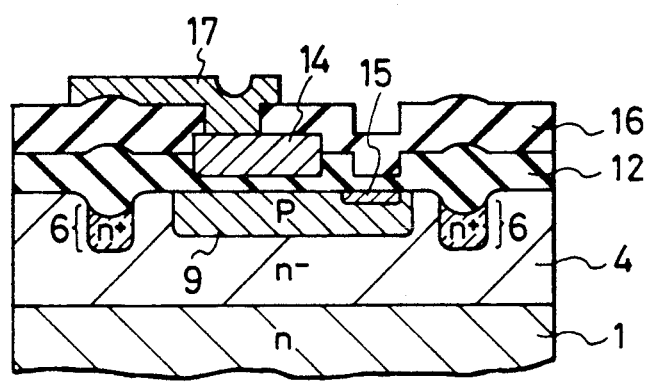
Figure 4L:
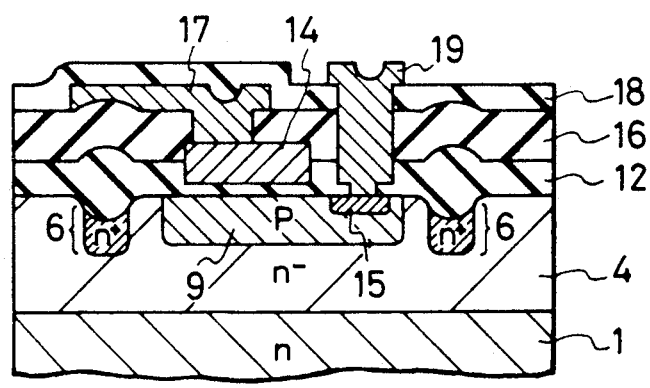

After the ion-implantation and removal of the resist 10, the p base region 9 is formed down to a predetermined depth through heat diffusion under the condition of 1000 to 1100° C. and N$_2$ atmosphere, and at the same time a thick oxidized film 12 is formed on the surface of the substrate 1 [FIG. 4G].

The depth of the p base region 9 is 0.6 to 1 μm for example. The depth and impurity density are determined on the basis of the following technical concept.

To obtain a high sensitivity, it is desirous to make the base emitter capacitance Cbe smaller by lowering the impurity density of the p base region 9. Cbe is given approximately by the following formula:

$$C_{be} = A_e \epsilon \left( \frac{q \cdot N_A}{2 \epsilon V_{bi}} \right)^{\frac{1}{2}}$$

wherein Vbi is a diffusion potential between the emitter and the base which is given by:

$$V_{bi} = \frac{kT}{q} \ln \frac{N_A N_D}{n_i^2}$$

wherein $\epsilon$ is a dielectric constant of silicon crystal, $N_D$ is an impurity density of the emitter, $N_A$ is an impurity density of the base near the emitter region, $n_i$ is an intrinsic carrier density, Ae is an area of the base region, k is the Boltzmann constant, T is an absolute temperature, and q is a unit electric charge. The sensitivity can be made higher the smaller $N_A$ is made and hence the smaller Cbe is made. However, if $N_A$ is made too small, the base region is completely depleted under operation and takes a punch-through state. Therefore, $N_A$ cannot be made too small. For this reason, $N_A$ is set at a proper value that the base region cannot completely be depleted and does not take a punch-through state.

An alternative method of forming the base region 9 is to deposit BSG on the wafer and diffuse impurity B down to a predetermined depth through heat treatment at 1100 to 1200° C.

Next, the parts of the oxidized film 12 are selectively removed where the capacitor electrode and the emitter region are formed. In the openings thus formed, a gate oxidized film 7 and an oxidized film 7' are formed to the thickness of 100 to 1000 Å [FIG. 4H].

Thereafter, polysilicon with As doped is deposited by means of a CVD method using (N$_2$+SiH$_4$+AsH$_3$) gas or (H$_2$+SiH$_4$+AsH$_3$) gas. The deposition temperature is about 550 to 900° C. and the thickness is 2000 to 7000 Å. Obviously, it is also possible to deposit non-doped polysilicon by means of a CVD method and thereafter diffuse As or P. The deposited polysilicon film is partially etched by means of a photolithography process to form a polysilicon electrode 14 [FIG. 4I].

Next, impurity ions such as P or As are ion-implanted through the oxidized film 7' into the area where an emitter region is formed. After heat treatment, an n$^+$ region 15 is formed [FIG. 4J].

In this embodiment although the n$^+$ emitter region 15 is formed by means of an ion implantation method, the emitter region 15 may be formed in such a way that the oxidized film 7' is removed, in the opening thus obtained polysilicon is deposited at the process forming the polysilicon 14, and impurity such as P or As in the polysilicon is diffused into the p base region 9 through heat treatment to form the emitter region.

Next, a PSG film or SiO$_2$ film 16 is deposited by means of a CVD method using the above-described gas to the thickness of 300 to 7000 Å. Succeedingly, a contact hole is formed on the polysilicon by mask alignment and etching processes. An electrode 17 (metal such as Al, Al-Si, Al-Cu-Si) is deposited in the contact hole by means of a vacuum evaporation or sputtering method [FIG. 4K].

Succeedingly, an interlayer insulation film 18 such as PSG film or SiO$_2$ film is deposited to the thickness of 3000 to 9000 Å by means of a CVD method. A contact hole is formed on the emitter region 15 by mask alignment and etching processes to form an electrode 19 (metal such as Al, Al-Si, Al-Cu-Si) [FIG. 4L].

Lastly, a passivation film 20 (such as PSG film or Si$_3$N$_4$ film) is formed by means of a CVD method and thereafter, and electrode 21 (metal such as Al, Al-Si, Au) is formed at the back of the wafer. Thus, a photoelectric conversion device as shown in FIGS. 2A and 2B is manufactured.

In this embodiment, although the semiconductor region beneath the oxidized film 24 of the element isolation region 6 uses an n$^+$ semiconductor, the present invention is not limited to this conduction type but a p$^+$ semiconductor is also applicable in case of a PNP bipolar transistor.

As seen from the foregoing detailed description of the photoelectric conversion device of the present invention, the isolation region for electrically insulating each cell is constructed of an insulation region and a semiconductor region formed beneath the insulation region. In addition, the semiconductor region has the same conductive type as that of the main electrode regions of the semiconductor transistor. As a result, a semiconductor region of high impurity density is formed at an area deep in the isolation region so that the electrical insulation effect for each cell is enhanced.

Furthermore, it is not necessary to form an isolation region made of insulated material by using conventional, complicated processes, but it is possible to form an isolation region with ease by employing ordinary methods such as a selective oxidation method and an implantation method, thereby enabling a high integration of the device.

Still further, since the insulation region of the isolation region may be made of oxidized material formed by selective oxidation, the isolation region can be formed without etching processes. Therefore, the manufacturing processes are simplified. In addition, semiconductor crystal is not subjected to damages so that leakage current between cells and the like are reduced to thereby stabilize the operation of each cell.

What is claimed is:

1. A photoelectric conversion device comprising:
   a plurality of phototransistors each comprising:
   a base region comprising a semiconductor of a first conductivity type;
   an emitter region comprising a semiconductor of a second conductivity type different from the first conductivity type; and
   a collector comprising semiconductor of the second conductivity type, wherein
   a photo-excited carrier is stored in said base region in a floating state,
   a junction between said emitter and base regions is forwardly biased, thereby reading a signal into the emitter side in a floating state,
   a junction between said emitter and base regions is forwardly biased for refreshment while said emitter is held at a reference potential, and
   based on the carriers stored in said base region, a current flowing between said emitter and collector regions is controlled, and
   wherein said device comprises a common substrate common to said plurality of phototransistors, a first region provided on a major surface of the common substrate, said first region having an impurity concentration lower than that of said common substrate, and a second region, provided between said plurality of base regions and on said first region, said second region having an impurity concentration higher than that of said common substrate, a part of said first region being sandwiched between said common substrate and said second region, and wherein a first potential is applied to an electrode in contact with a back side surface of said common substrate and a second potential is applied to another electrode in contact with said second region, the first and second potentials being equal to each other.

2. A photoelectric conversion device according to claim 1, wherein said second region is made of oxidized material formed through selective oxidation.

* * * * *

UNITED STATES PATENT AND TRADEMARK OFFICE
CERTIFICATE OF CORRECTION

PATENT NO. : 5,309,013
DATED : May 3, 1994
INVENTOR(S) : TOSHIJI SUZUKI, ET AL.

It is certified that error appears in the above-identified patent and that said Letters Patent is hereby corrected as shown below:

ON TITLE PAGE

In [56] References Cited, under U.S. PATENT DOCUMENTS:
"4,686,554  7/1987  Ohmi et al." should read
--4,686,554  8/1987  Ohmi et al.--.

COLUMN 4

Line 8, "Table 1" should read --Table 1,--.

COLUMN 5

Line 2, "at" should read --at a--.

COLUMN 8

Line 1, "semiconductor" should read --a semiconductor--.

Signed and Sealed this

Thirteenth Day of December, 1994

Attest:

BRUCE LEHMAN

Attesting Officer

Commissioner of Patents and Trademarks